United States Patent [19]

Iwasaki et al.

[11] 4,139,384
[45] Feb. 13, 1979

[54] PHOTOSENSITIVE POLYMERIC O-QUINONE DIAZIDE CONTAINING LITHOGRAPHIC PRINTING PLATE AND PROCESS OF USING THE PLATE

[75] Inventors: Masayuki Iwasaki; Hiroshi Misu, both of Minami-ashigara; Shizuo Miyano, Odawara, all of Japan

[73] Assignee: Fuji Photo Film Co., Ltd., Minami-ashigara, Japan

[21] Appl. No.: 789,587

[22] Filed: Apr. 21, 1977

Related U.S. Application Data

[63] Continuation of Ser. No. 551,813, Feb. 21, 1975, abandoned.

[30] Foreign Application Priority Data

Feb. 21, 1974 [JP] Japan ................................. 49-20925

[51] Int. Cl.$^2$ .......................... G03F 7/08; G03C 1/54; G03C 1/70
[52] U.S. Cl. .......................................... 96/33; 96/75; 96/86 P; 96/91 D; 96/115 R; 101/456
[58] Field of Search ................. 96/91 D, 33, 115 R, 96/75, 86 P; 101/453, 456, 454, 459

[56] References Cited

U.S. PATENT DOCUMENTS

| | | | |
|---|---|---|---|
| 3,046,120 | 7/1962 | Schmidt et al. | 96/91 D |
| 3,046,121 | 7/1962 | Schmidt | 96/91 D |
| 3,046,122 | 7/1962 | Sus | 96/91 D |
| 3,046,123 | 7/1962 | Sus et al. | 96/91 D |
| 3,502,470 | 3/1970 | Delzenne et al. | 96/91 D |
| 3,551,154 | 12/1970 | Di Blas et al. | 96/91 D |
| 3,647,443 | 3/1972 | Rauner et al. | 96/91 D |
| 3,759,711 | 9/1973 | Rauner et al. | 96/91 D |
| 3,902,906 | 9/1975 | Iwama et al. | 96/115 R |

FOREIGN PATENT DOCUMENTS

| | | | |
|---|---|---|---|
| 1026144 | 4/1966 | United Kingdom | 96/91 D |
| 1227602 | 4/1971 | United Kingdom | 96/91 D |
| 216450 | 8/1968 | U.S.S.R. | 96/91 D |

OTHER PUBLICATIONS

Dinaburg, M., "Photosensitive Diazo Compounds", The Focal Press, 1964, pp. 182–191.

*Primary Examiner*—Charles L. Bowers, Jr.
*Attorney, Agent, or Firm*—Sughrue, Rothwell, Mion, Zinn and Macpeak

[57] ABSTRACT

A photosensitive lithographic printing plate comprising a support having thereon a photosensitive layer composed of a photosensitive diazo-oxide resin containing a hydroxystyrene unit and a hydroxystyrene unit having an o-quinoediazide group bonded through the oxygen of the hydroxystyrene. The photosensitive layer can contain an alkali-soluble resin. The photosensitive lithographic printing plate is stable mechanically, provides a large difference in solubility between the exposed areas and the unexposed areas of the layer, and has improved printability and sensitivity.

16 Claims, 3 Drawing Figures

PHOTOSENSITIVE POLYMERIC O-QUINONE DIAZIDE CONTAINING LITHOGRAPHIC PRINTING PLATE AND PROCESS OF USING THE PLATE

This application is a continuation of Ser. No. 551,813, filed Feb. 21, 1975, now abandoned.

BACKGROUND OF THE INVENTION

1. Field of the Invention

The present invention relates to a photosensitive lithographic printing plate and more particularly, the invention relates to a lithographic printing plate having a photosensitive layer of a novel and improved photosensitive diazo-oxide resin.

2. Description of the Prior Art

It is well known to use a photosensitive diazo-oxide in the production of photocopies or photoresists and also as a photosensitive material for lithographic printing plates. In these techniques, as the result of light exposure, due to the properties of the photosensitive diazo-oxide, a difference in solubility between the exposed areas and the unexposed areas results and by treating the exposed layer of such a material with an appropriate solvent, a desired image portion remains on the support while undesired portions are washed away from the support. These techniques are described in detail in the specifications of, e.g., U.S. Pat. Nos. 3,046,121, 3,046,122, and 3,046,123. In the above patents, the ester or acid amide of benzenediazo-oxide or naphthalenediazo-oxide is used as the photosensitive material for photosensitive lithographic printing plates. Other various materials for this purpose have also been reported.

However, almost all of these components are low molecular weight compounds and when such a compound is used individually for a photosensitive lithographic printing plate, crystallization occurs, which results in a poor film of the compound being obtained, and thus the image formed has low mechanical strength. This makes it difficult to obtain many satisfactory copies or prints. Therefore, the aforesaid photosensitive material is frequently used together with an alkali-soluble resinous binder or as a compound formed by the reaction thereof with an alkalisoluble resinous material.

Such polymers are described in the specifications of U.S. Pat. No. 3,046,120, British Pat. No. 1,113,759, and U.S. Pat. Application Ser. No. 684,636, filed on Nov. 21, 1967 now abandoned. The compounds described in these specifications are mainly polymers such as phenol resins and aminostyrene resins.

However, although these compounds may have good sensitivity and provide sufficient difference in solubility between the exposed areas and the unexposed areas, they have the disadvantages that coated layers of these compounds are brittle and have a comparatively poor flexibility.

SUMMARY OF THE INVENTION

An object of this invention is, therefore, to provide a photosensitive lithographic printing plate having a layer of a photosensitive diazo-oxide resin without the above-described disadvantages.

Another object of this invention is to provide a stable photosensitive lithographic printing plate having a layer of a photosensitive diazo-oxide resin comprising a polymer in which a diazo-oxide compound, which is a photosensitive group, is bonded, as a side chain, to the main chain of a homopolymer or copolymer of hydroxystyrene.

Still another object of this invention is to provide a photosensitive lithographic printing plate having a photosensitive layer having a large difference in solubility in a developer between the exposed portions and the unexposed portions thereof.

A further object of this invention is to provide a photosensitive lithographic printing plate having a long press life and high sensitivity.

As the results of various investigations on attaining the above-described objects of this invention, the photosensitive lithographic printing plate of this invention has been obtained. That is to say, according to the present invention there is provided a photosensitive lithographic printing plate comprising a support having thereon a layer of a photosensitive diazo-oxide resin containing a hydroxystyrene unit and a hydroxystyrene unit having an o-quinonediazide group bonded thereto through the oxygen atom of hydroxystyrene.

Also, according to another embodiment of this invention there is provided a photosensitive lithographic printing plate comprising a support having thereon a layer of a photosensitive composition comprising a photosensitive diazo-oxide resin and an alkali-soluble resin, the photosensitive diazo-oxide resin containing a hydroxystyrene unit and a hydroxystyrene unit having an o-quinonediazide group bonded thereto through the oxygen atom of hydroxystyrene.

BRIEF DESCRIPTION OF THE ACCOMPANYING DRAWINGS

DETAILED DESCRIPTION OF THE INVENTION

Figure 1:
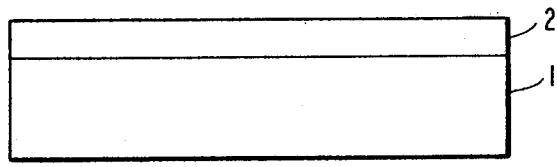
FIG. 1 is a schematic cross sectional view showing an embodiment of the photosensitive lithographic printing plate of this invention.

The lithographic printing plate of this invention comprises a support with a hydrophilic surface having thereon a photosensitive layer mainly comprising a specific photosensitive diazo-oxide resin.

The support used in this invention is a dimensionally stable support such as a sheet or plate and various kinds of supports which have hitherto been used for printing plates can be used in this invention. Examples of such supports include paper; a paper coated with a polymer (such as polyethylene, polypropylene, polystyrene, etc.); a plate or a sheet of a metal such as aluminum, an aluminum alloy, zinc, copper, etc.; a film of a polymer such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.; a paper or a polymer film having coated or vacuum deposited thereon a metal as described above.

Of these supports, an aluminum support is dimensionally stable, is inexpensive, and is particularly preferred. Furthermore, a composite sheet of a polyethylene terephthalate film having an aluminum sheet bonded thereto is also preferred as a support.

Particularly, the surface of the support must be hydrophilic and various methods are known for rendering the surface hydrophilic.

For instance, for a support with a polymer surface, surface treatments such as a chemical treatment, a corona discharge treatment, a flame treatment, an ultraviolet treatment, a high frequency wave treatment, a glow discharge treatment, a laser treatment, etc., (as described in the specifications of U.S. Pat. Nos. 2,764,520, 3,497,407, 3,145,242, 3,376,208, 3,072,483, 3,475,193 and 3,360,448 and the specification of British Pat. No. 788,365) can be used and a method where the surface is subjected to the aforesaid surface treatment and then a subbing layer is formed on the treated surface of the polymer layer can be employed. A suitable subbing layer comprises a coating of a 1% by weight acrylic acid aqueous solution or a coating of polyvinyl alcohol onto a grained aluminum plate, which, when washed, provides a hydrophilic coating. A diazo resin layer is then coated thereon. Suitable examples of subbing layers are disclosed in British Pat. No. 918,599 and U.S. Pat. No. 3,064,562.

Various approaches have been used for forming a subbing layer on the polymer surface. For instance, a double layer method in which a hydrophobic resin layer which adheres well to the polymer surface and has good solubility is formed on the polymer surface as a first layer and then a hydrophilic layer is formed as a second layer and a single layer method in which a layer of a polymer having a hydrophobic group and a hydrophilic group in the same molecule is formed on the polymer surface have been used.

Also, in the case of a support having a metallic surface, in particular, the surface of aluminum, preferably the surface of the metallic layer or support has been subjected to a graining treatment, an immersion treatment in an aqueous solution of sodium silicate, potassium fluorozirconate, a phosphate, etc., or an anodic oxidation treatment. Also, an aluminum plate which is grained and immersed in an aqueous solution of sodium silicate as described in the specification of U.S. Pat. No. 2,714,066 and an aluminum plate which is subjected to an anodic oxidation treatment and then immersed in an aqueous solution of an alkali metal silicate as described in the specification of U.S. Pat. No. 3,181,461 can be used appropriately in this invention. The above-described anodic oxidation treatment can be conducted by placing the aluminum plate in an electrolyte of an aqueous solution or a non-aqueous solution of an inorganic acid such as phosphoric acid, chromic acid, sulfuric acid, boric acid, etc., an organic acid such as oxalic acid, sulfamic acid, etc., or a salt thereof or of a combination of these solutions and an electric current is passed using the aluminum plate as the anode.

Moreover, the electrodeposition of silicate as described in the specification of U.S. Pat. No. 3,658,662 can be effectively employed for the surface treatment of an aluminum layer or sheet.

The above-described surface treatment is employed, in addition to rendering surface of a support hydrophilic, to prevent the occurrence of any harmful reactions with the photosensitive composition formed thereon and to improve the adherence between the support surface and the photosensitive layer formed thereon. In particular, however, when aluminum is used as the support, the surface thereof has sufficient hydrophilic property without the necessity of any surface treatment to render the surface hydrophilic and hence the surface treatment as described above is applied to the surface of the aluminum support mainly for preventing the occurrence of any harmful reactions with the photosensitive composition and improving the adherence between the support surface and the photosensitive layer formed thereo.

The photosensitive diazo-oxide resin used in this invention contains at least a hydroxystyrene unit and a hydroxystyrene unit having an o-quinonediazide group bonded thereto through the oxygen atom of the hydroxystyrene. Examples of such a resin are those containing therein structural units represented by the following general formulas (I) and (II)

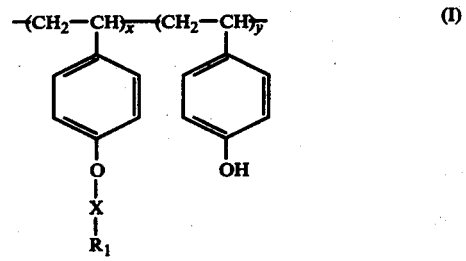

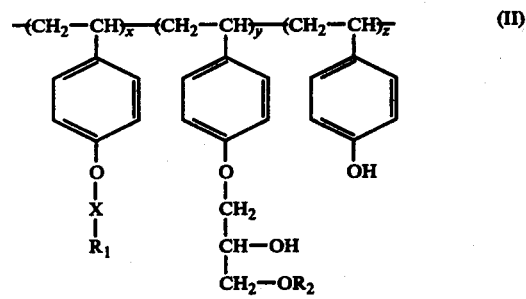

wherein X represents a connecting group such as a sulfonyl group

or a carbonyl group

etc.; $R_1$ represents an aromatic o-quinonediazide group such as 1,2-benzoquinonediazide, 1,2-naphthoquinonediazide, 3,3', 4,4'-biphenyl-bis-quinonediazide, 2,3-phenanthrenequinonediazide, etc., in which the o-quinonediazide group can have a substituent on the aromatic nucleus, for instance, an alkyl group (e.g., having generally 1 to 8 carbon atoms such as a methyl group, an ethyl group, a propyl group, a butyl group, an amyl group, a hexyl group, a heptyl group, an octyl group, etc.) or an alkoxy group (e.g., having generally 1 to 8 carbon atoms such as a methoxy group, an ethoxy group, a propoxy group, a butoxy group, an amyloxy group, a hexyloxy group, a heptyloxy group, an octyloxy group, etc.); and $R_2$ represents an alkyl group (e.g., having 1 to 4 carbon atoms), an aryl group (e.g., a phenyl group, a tolyl group, a xylyl group, a naphthyl group, etc.), or a substituted aryl group and further $R_2$ can include a quinonediazide group substituted with an alkyl or aryl group if the photodecomposition of the quinonediazide is not affected by such a substituent. Hereinafter, for brevity, the compound containing therein structural units of the general formula (I) is designated "compound of the general formula (I)" and the compound containing therein structural units of the general formula (II) is designated "compound of the general formula (II)".

The molecular weight of the compound of the general formula (I) can range from about 1,000 to about 300,000, preferably from 3,000 to 100,000, x and y each represents the molar proportions of the components designated and x/x+y is from about 0.05 to 0.5, preferably from 0.1 to 0.4.

The compound of the general formula (I) can be prepared using, for instance, the following polymerization reaction. That is to say, poly(p-hydroxystyrene) which becomes the main chain of the polymer and an acid halide of a diazo-oxide to be reacted, such as, for instance, quinonediazidosulfonyl chloride, quinonediazidocarbonyl chloride, etc., are uniformly dissolved in a common solvent such as dioxane, tetrahydrofuran, acetone, etc., and then the reaction, generally at about −10° C. to 80° C., preferably 20° C. to 40° C., is conducted by adding, for instance, sodium carbonate, sodium bicarbonate, potassium carbonate, potassium bicarbonate, pyridine, etc., to the solution as a base, generally in an amount substantially equivalent to the quinonediazido acid halide. A suitable molar ratio of the acid halide to the poly-(p-hydroxystyrene) is about 0.1 to 1 equivalent, preferably 0.2 to 0.8 equivalent, per hydroxyl group equivalent. Then, by purifying the reaction mixture thus obtained by a recrystallization method, the photosensitive diazo-oxide resin of this invention is obtained. The poly-(p-hydroxystyrene) can be prepared in accordance with the disclosure in *J. Poly. Sci.* A-1, 7, 2175–2184 (1969) and ibid., 7, 2405–2410 (1969).

The molecular weight of the compound shown by general formula (II) can range from about 1,000 to about 300,000, preferably from 3,000 to 100,000. Also, x, y and z each represents the molar proportions of the components designated and the ratio x/x+y+z is from about 0.05 to 0.5 and the ratio y/x+y+z is from about 0.05 to 0.2.

The compound of the general formula (II) can be prepared in the following manner. That is to say, poly-(p-hydroxystyrene) which is also used as a starting material in the production of the compound of general formula (I) is first reacted with a glycidyl ether such as phenylglycidyl ether in a solvent such as acetone, tetrahydrofuran, methyl ethyl ketone, dioxane, etc., preferably methyl ethyl ketone, in the presence of triethylamine, 1,4-diazabicyclo[2,2,2]octane etc., in an amount of about 0.005 to 0.1 g, preferably 0.01 to 0.2 g, per g of the poly-(p-hydroxystyrene), e.g., at about −10° C. to 80° C., preferably 20° C. to 40° C., particularly preferably at reflux, to form the polymer containing therein structural units represented by the following general formula (III)

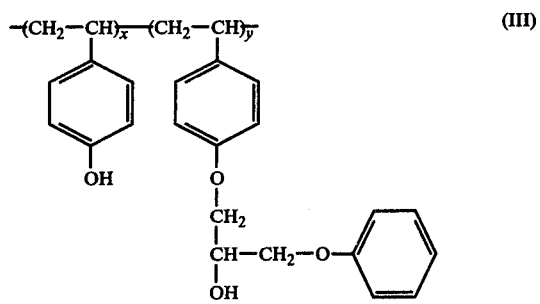

wherein x and y are as described above.

Then, by reacting the polymer of general formula (III) thus formed with the acid halide of a diazo-oxide as in the case of producing the compound of general formula (I) and under the conditions as described above, the compound of general formula (II) is obtained. Alkyl substituted glycidyl ethers and alkyl substituted phenyl glycidyl ethers in which the alkyl moiety has 1 to 4 carbon atoms can also be used as a starting material in the above procedures.

In the above-described processes of producing the photosensitive diazo-oxide resin of this invention, polyhydroxystyrene is used as the starting material but in place of such a compound, a copolymer of hydroxystyrene and a monomer not having a group with which the o-quinonediazide and the photodecomposition product thereof reacts can also be used as the starting material. Examples of such a copolymerizable comonomer for the copolymer are phthalic anhydride, styrene, acrylonitrile, an acrylic acid ester, and a methacrylic acid ester.

The photosensitive diazo-oxide compound of this invention can be used individually as a photosensitive layer of the photosensitive lithographic printing plate of this invention but it is more preferable to use the compound together with an alkaline solution-soluble resin as a binder therefor. Preferred examples of such an alkali-soluble resin are phenol-formaldehyde resins, cresol resins, styrene-maleic anhydride copolymers, and shellac. A suitable molecular weight range for the phenol-formaldehyde resins and the cresol resins can range from about 2,000 to 50,000, preferably 4,000 to 10,000, and for the styrene-maleic anhydride copolymer can range from about 5,000 to 20,000, preferably 8,000 to 14,000. Such a resin is soluble in an alkaline solution, has high adhesivity to support, and provides desirable effects in printability. Examples of such resins are disclosed in Synthetic Resins in Coating, H. P. Preuss Noyes Development Corp., Pearl River, N.Y. (1965).

In using the mixture of the photosensitive diazo-oxide compound of this invention and the alkaline solution-soluble binder resin, a suitable proportion of the photosensitive diazo-oxide is more than about 20% by weight. If the proportion of the photosensitive diazo-oxide is less than about 20% by weight of the mixture, difficulties in development occur providing images which are not sufficient and hence good prints are not obtained.

Furthermore, by incorporating the various additives as described hereinafter in the photosensitive layer of the photosensitive lithographic printing plate of this invention, the printing plate can be provided with desired specific properties. For instance, in order to obtain visible images by light exposure and development of the photosensitive lithographic printing plate, a dye can be incorporated in the photosensitive layer of the printing plate. Suitable examples of appropriate dyes which can be used for this purpose include C.I. 26,105 (Oil Red RR), C.I. 21,260 (Oil Scarlet 308), C.I. 74,350 (Oil Blue), C.I. 52,015 (Methyl Blue), C.I. 42,555 (Crystal Violet), etc. Such a dye can be incorporated in the photosensitive layer in an amount which provides a sufficiently clear contrast between the color of the hydrophilic surface of the support exposed by light-exposure and development of the photosensitive layer of the photosensitive lithographic printing plate and the color of the remaining portions of the photosensitive layer and, in general, it is appropriate to incorporate the dye at a level of less than about 7% by weight to the total amount of the photosensitive composition for forming the photosensitive layer.

Also, the photosensitive composition can contain a plasticizer for imparting the desired flexibility to the photosensitive layer formed on the support. Examples of effective plasticizers which can be used for this purpose are phthalic acid esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, diaryl phthalate, etc.; glycol esters such as dimethylglycol phthalate, ethylphthalylethyl glycolate, methylphthalylethyl glycolate, butylphthalylbutyl glycolate, triethyleneglycol dicaprylic acid ester, etc.; phosphoric acid esters such as tricresyl phosphate, triphenyl phosphate, etc.; aliphatic dicarboxylic acid esters such as diisobutyl adipate, dioctyl adipate, dimethyl sebacate, dioctyl azelate, dibutyl maleate, etc.; polyglycidyl methacrylate; citric acid triethyl ester; glycerin triacetyl ester; and butyl laurate.

The plasticizer is usually employed in an amount of less than about 5% by weight to the total amount of the photosensitive composition.

Also, in order to obtain visible images immediately by exposing the photosensitive lithographic printing plate of this invention, the following spiropyran compounds which are discolored by light exposure can be incorporated in the photosensitive compositions as described in the specification of British Pat. No. 1,154,716. Suitable examples include 6-nitrobenzoindolinospiropyran, 1,3,3-trimethylindolino-8'-methoxy-6'-nitrobenzospiropyran, 6'-nitro-1,3,3-trimethylindoline benzospiropyran, 1,3,3-trimethylindolinobenzospiropyran, 1,3,3-trimethylindolino-β-naphthospiropyran, xantho-β-benzospiropyran, 6'-nitro-1,3,3-trimethylspiro(indoline-2,2'-2'H-chromene), 6',8'-dichloro-1,3,3-trimethylspiro(indoline-2,2'-2'H-chromene), etc. A suitable amount of the spiropyran compound is about 2 to 20% by weight to the total amount of the photosensitive composition.

The photosensitive composition containing the photosensitive diazo-oxide compound of this invention together with, if desired, the above-described additives is coated on a support having a hydrophilic surface as a solution or a dispersion in an appropriate solvent. Examples of the solvent which can be used for this purpose are organic solvents such as ketones, e.g., methyl ethyl ketone, acetone, methyl isobutyl ketone, etc.; ethyleneglycol monoalkyl ethers, e.g., ethyleneglycol methyl ether, ethyleneglycol monoethyl ether, etc.; ethers, e.g., dioxane, tetrahydrofuran, etc.; and a mixed solvent thereof, such as ethylene dichloride and methyl cellosolve acetate. When the photosensitive composition is coated as a solution thereof, preferably the concentration of the composition in the solution is about 1 to 50% by weight, preferably 4 to 20% by weight.

The coating composition can be coated using conventional methods such as, for instance, dip coating, air knife coating, bead coating, curtain coating, and also extrusion coating using the hopper as described in the specification of U.S. Pat. No. 2,681,294.

The amount of the photosensitive layer coated on a support generally ranges from about 0.1 g/m$^2$ to about 5 g/m$^2$ but the amount of the photosensitive layer suitable for obtaining from about 10,000 to 100,000 good copies ranges from about 1.0 g/m$^2$ to about 3.5 g/m$^2$. If particular care is taken, however, in making the printing plate or in printing, about 5,000 good copies can be obtained with a coated amount of as low as about 1 g/m$^2$. If a longer press life is required, the coating composition preferably is coated in an amount of about 3.5 g/m$^2$. In this case, a considerable amount of exposure is required at image exposure of the photosensitive layer.

The photosensitive lithographic printing plate of this invention is exposed to active light, such as a carbon arc lamp, a mercury lamp, a xenon lamp, a tungsten lamp, etc., and then the exposed portions of the photosensitive layer are removed by processing the plate with a developer, whereby the hydrophilic surface of the support is uncovered at the portions removed.

Suitable developers for the photosensitive lithographic printing plate of this invention basically include conventioanal alkaline solutions which have hitherto been used as developers for a photosensitive layer comprising a photosensitive diazo-oxide compound. Such alkaline solutions can suitably have a pH of about 9.5 to 12. For instance, an aqueous solution of an alkali such as sodium hydroxide, potassium hydroxide, sodium silicate, potassium silicate, sodium tertiary phosphate, sodium primary phosphate, sodium carbonate, potassium carbonate, etc., or an aqueous solution of a basic solvent such as ethanolamine is used. These alkaline aqueous solutions as described above can be used individually or as a mixture thereof. Furthermore, if desired, the alkaline aqueous solution can further contain certain organic solvents, for instance, benzyl alcohol, 2-butoxyethanol, 2-methoxyethanol, n-propanol, etc., in an amount of less than about 10% by weight, preferably about 1 to 2% by weight. By using a small amount of the organic solvent as indicated above, the speed of the development can be remarkably increased.

Furthermore, if desired, the developer can contain a wetting agent (e.g., a surface active agent). Examples of preferred wetting agents include compounds having more than 6 carbon atoms, each having a hydrophilic group such as a hydroxyl group, a carboxyl group, a sodium carboxylate group, a sulfo group, a sodium sulfonate group, and an alkyleneoxy group. Such wetting agents are well known as anionic surface active agents and nonionic surface active agents. Examples of anionic surface active agents which can be used as a wetting agent in the developer are long chain alcohol (e.g., having about 8 to 22 carbon atoms) sulfuric acid esters, aliphatic alcohol phosphoric acid esters, sulfonates of dibasic aliphatic acid esters, aliphatic amidosulfonates, etc.

Examples of nonionic surface active agents are polyoxyethylene alkyl ethers, polyoxyethylene alkyl esters, sorbitan alkyl esters, polyoxypropylene ethers, polyoxyethylene ethers, etc. Specific examples of these surface active agents are described in *Kaimen Kasseizai*

*Binran (Handbook of Surface Active Agents)*, published by Sangyo Tosho K.K. in 1961.

Specifically preferred wetting agents used in this invention are Duponol ME (the trade name of the sodium salt of lauryl alcohol sulfate made by E. I. du Pont de Nemours & Co.), Monogen Y-100 (the trade name of sodium lauryl sulfate made by Daiichi Kogyo Seiyaku K.K.), the sodium salt of octyl alcohol sulfuric acid ester, the ammonium salt of lauryl alcohol sulfuric acid ester, the sodium salt of xylenol sulfuric acid ester, Duponol LS (the trade name of the sodium salt of oleyl alcohol sulfuric acid ester made by E. I. du Pont de Nemours & Co.), the monosodium salt of N,N-dihydroxyethylglycine, and the like. Of these compounds, the sodium salt of lauryl alcohol sulfuric acid ester is most preferred. These surface active agents can be used individually or as a combination of two or more compounds. Also, the amount of the surface active agent can vary but generally the surface active agent is used at about 0.005 to 30% by weight, preferably 0.5 to 10% by weight, most preferably 4 to 8% by weight of the developer.

The development is conducted by contacting the image exposed photosensitive layer of the photosensitive lithographic printing plate of this invention with the developer as described above. The contact can be using various methods such as, for instance, immersion, spraying, etc.

After contacting the photosensitive layer and the developer for 60 to 180 seconds, the surface of the printing plate is softly rubbed using an appropriate brush, absorbent cotton, etc., whereby only the exposed portions of the photosensitive layer are removed. In order to conduct development more effectively, the exposed surface preferably is processed with a developer at a temperature higher than about room temperature (about 20°–30° C.), for instance, at about 40° to 50° C.

To further clarify the invention, the invention will be explained additionally by referring to the accompanying drawings.

In an embodiment of the photosensitive lithographic printing plate of this invention as illustrated in FIG. 1, a photosensitive layer 2 mainly consisting of the novel diazo-oxide compound of this invention is formed on a support 1, such as an aluminum support, having a hydrophilic surface.

Figure 2:
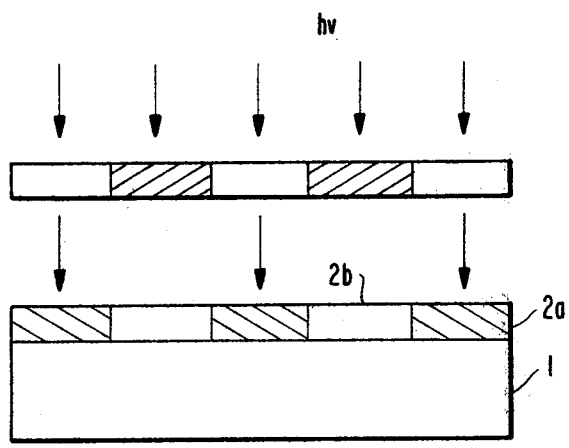
FIG. 2 is a cross sectional view of the photosensitive lithographic printing plate shown in FIG. 1 after exposure.

By image exposing the photosensitive lithographic printing plate shown in FIG. 1, the exposed portion 2a becomes alkaline solution-soluble as shown in FIG. 2.

Figure 3:
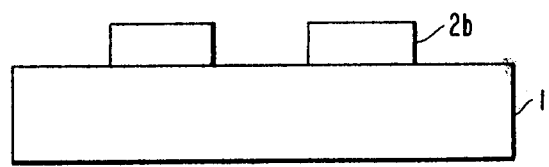
FIG. 3 is a cross sectional view of the photosensitive lithographic printing plate shown in FIG. 2 after development.

The state of the image exposed photosensitive layer after development is shown in FIG. 3 as a cross sectional view. As shown in FIG. 3, the exposed portions 2a of the photosensitive layer 2 have been removed and the hydrophilic surface of the support 1 has been uncovered there. The uncovered surface of the support is hydrophilic and oleophobic. On the other hand, the unexposed portions 2b of the photosensitive layer 2 remain on the support after development and the surface thereof is oleophilic and hydrophobic. Thus, a printing plate is obtained.

In the present invention, by using the novel photosensitive diazo-oxide compound, a photosensitive lithographic printing plate having high sensitivity and exhibiting excellent printability is obtained. Furthermore, the lithographic printing plate of this invention is superior in ink-receptivity and the control of fountain solution in printing becomes quite simple in the case of using the printing plate made from the photosensitive lithographic printing plate of this invention. Moreover, the lithographic printing plate of this invention is stable to the passage of time.

Thus, by using the lithographic printing plate of this invention, very excellent copies are obtained.

The invention will be described further by reference to the following examples. Unless otherwise indicated herein, all parts, percents, ratios and the like are by weight.

SYNTHESIS EXAMPLE 1

27 g of naphthoquinone-1,2-diazido-5-sulfonyl chloride and 12 g of poly-(p-hydroxystyrene) having a mean molecular weight of 4,770 were dissolved in 100 ml of tetrahydrofuran at room temperature. While stirring the solution, 40 g of an aqueous solution of 13% by weight sodium carbonate was added dropwise to the solution at 30° C. over a period of 45 minutes. After distilling off excess tetrahydrofuran under reduced pressure, 100 ml of the reaction mixture was added to about 1 l of water followed by stirring vigorously, whereby yellow precipitates were formed. The precipitates were recovered by filtration, washed with water several times, and dried at room temperature under reduced pressure to provide 21 g of the photosensitive diazo-oxide resin.

SYNTHESIS EXAMPLE 2

18 g of poly-(p-hydroxystyrene), 1 ml of triethylamine, and 2.3 g of phenylglycidyl ether were reacted in 120 ml of methyl ethyl ketone under refluxing for 8.5 hours. Thereafter, methyl ethyl ketone was distilled off under reduced pressure, the solid obtained was recovered and dissolved in about 100 ml of methanol. Then, the solution was added to about 750 ml of water, whereby precipitates were formed. The precipitates were recovered by filtration and dried under a reduced pressure to obtain 17 g of a resin. 15 g of this resin was reacted with 27 g of naphthoquinone-1,2-diazo-5-sulfonyl chloride in the same manner as described in Synthesis Example 1 to provide 22 g of the photosensitive diazo-oxide resin.

EXAMPLE 1

One part by weight of the photosensitive diazo-oxide resin prepared in Synthesis Example 1 described above, 2 parts by weight of a novolak-type phenol resin (a phenol-formaldehyde (1:0.8 molar ratio) condensation product obtained under acid conditions; molecular weight about 1,200 to 1,500), and 0.02 parts by weight of a dye, Oil Blue, were uniformly dissolved in 30 parts by weight of a mixed solvent of 12 parts by weight of ethylene dichloride and 18 parts by weight of methyl cellosolve acetate. The coating composition thus prepared was coated on an aluminum plate of a thickness of 0.24 mm, the surface of which had been grained using a rotary coating machine and dried. The coated amount was 3.1 g/m$^2$ on a dry basis.

The photosensitive lithographic printing plate thus obtained was exposed behind a transparent positive image to a Plano PS Light (3.5 amperes, using a metal halide lamp) made by Fuji Photo Film Co., Ltd., at a distance of 1 meter from the light source for 40 seconds and after immersing the exposed plate in a developer containing 5% by weight anhydrous sodium silicate for one minute at 25° C., the surface of the lithographic printing plate was softly rubbed, whereby the exposed portions were removed and a positive image of the original was obtained.

When the printing plate thus obtained was mounted on a rotary printer and used for printing, 50,000 good copies were obtained.

EXAMPLE 2

Three parts by weight of the photosensitive lithographic printing plate prepared in Synthesis Example 1 and 0.02 parts by weight of a dye, Oil Blue, were uniformly dissolved in 30 parts by weight of a mixed solvent of 12 parts by weight of ethylene dichloride and 18 parts by weight of methyl cellosolve acetate. The coating composition was coated on an aluminum plate of a thickness of 0.3 mm, which had been subjected to graining using a rotary coating machine. In this case the coated amount was 2.6 g/m² on a dry basis.

The photosensitive lithographic printing plate thus obtained was exposed behind a transparent positive image to a Plano PS Light made by Fuji Photo Film Co., Ltd., as a light source for 3 minutes with a distance of 1 meter from the light source as in Example 1 and after immersing the exposed plate in a developer containing 5% by weight anhydrous sodium silicate for one minute at 25° C., the surface of the plate was softly rubbed, whereby the exposed portions were removed and a good printing plate was obtained.

When the printing plate was mounted on a rotary printer and used for printing, 45,000 good copies were obtained.

EXAMPLE 3

One part by weight of the photosensitive diazo-oxide resin prepared in Example 2, 2 parts by weight of a novolak-type phenol resin, and 0.02 part by weight of a dye, Oil Blue, were uniformly dissolved in 30 parts by weight of a mixed solvent of 12 parts by weight of ethylene dichloride and 18 parts by weight of methyl cellosolve acetate. The coating composition thus prepared was coated on an aluminum plate of a thickness of 0.3 mm, which had been subjected to graining using a rotary coating machine and dried. The coated amount was 2.4 g/m² on a dry basis.

The photosensitive lithographic printing plate was exposed behind a transparent positive image to the light source as described in Example 1 with a distance of 1 meter from the light source for 40 seconds and after immersing the exposed plate for one minute in a developer of 15 parts by weight of butyl cellosolve, 1 part by weight of sodium primary phosphate, 7.5 parts by weight of sodium tertiary phosphate, 10 parts by weight of polyvinyl pyrrolidone K-15 (made by General Aniline and Film Corp.), 2 parts by weight of Monogen Y-100 (trade name, made by Daiichi Kogyo Seiyaku K.K.), and 200 parts by weight of water, the surface of the plate was softly rubbed to provide a printing plate having excellent positive image.

When the printing plate thus obtained was used for printing on a rotary printer, 50,000 good copies were obtained.

EXAMPLE 4

Three parts by weight of the photosensitive diazo-oxide resin prepared in Example 2 and 0.02 part by weight of a dye, Oil Blue, were dissolved in 30 parts by weight of a mixed solvent of 12 parts by weight of ethylene dichloride and 18 parts by weight of methyl cellosolve acetate and the coating composition was coated on an aluminum plate, which had been subjected to graining using a rotary coating machine so that the coated amount was 2.3 g/m² on a dry basis.

The photosensitive lithographic printing plate was exposed behind a transparent positive image to a Plano PS Light made by Fuji Photo Film Co., Ltd. with a distance of 1 meter from the light source for 3 minutes and after immersing the exposed plate for 1 minute in a developer having the same composition as described in Example 3, the plate was softly rubbed to provide a printing plate having a good positive image.

When the printing plate thus obtained was used for printing on a rotary printer, 50,000 good copies were obtained.

While the invention has been described in detail and with reference to specific embodiments thereof, it will be apparent to one skilled in the art that various changes and modifications can be made therein without departing from the spirit and scope thereof.

What is claimed is:

1. A photosensitive lithographic printing plate which comprises a support having thereon a photosensitive layer comprising an o-quinonediazide group containing photosensitive polymer, said polymer containing, as essential components, monomer repeating units represented by the following general formulae (A) and (B), and having a molecular weight of 1,000 to 300,000, the amount of the photosensitive layer on said support ranging from about 0.1 to about 5 g/m²,

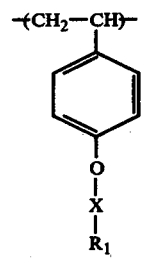

General Formula (A)

wherein X represents a sulfonyl group, and $R_1$ represents an aromatic o-quinonediazide group, with the aromatic group of the o-quinone-diazide group being unsubstituted or substituted with an alkyl group or an alkoxy group,

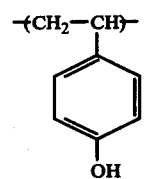

General Formula (B)

2. The photosensitive lithographic printing plate of claim 1 wherein said polymer also contains at least one monomer repeating unit selected from the group consisting of vinyl repeating units of styrene, acylonitrile, acrylic ester and methacrylic ester.

3. The photosensitive lithographic printing plate as set forth in claim 1, wherein said support is an aluminum support.

4. The photosensitive lithographic printing plate of claim 1 wherein said polymer consists of said unit represented by the general formulae (A) and (B).

5. A method of forming images comprising exposing the photosensitive lithographic printing plate as set forth in claim 1 to actinic radiation and developing said exposed photosensitive lithographic printing plate in an alkaline solution developer.

6. A photosensitive lithographic printing plate which comprises a support having thereon a photosensitive layer comprising an o-quinonediazide group-containing photosensitive polymer having a structure represented by the following general formula (I) or (II) and having a molecular weight of 1,000 to 300,000, the amount of the photosensitive layer on said support ranging from about 0.1 to about 5g/m²,

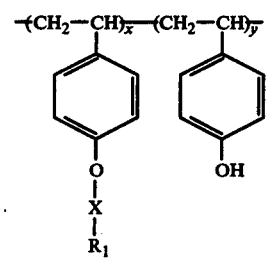
(I)

wherein X represents a sulfonyl group, $R_1$ represents an aromatic o-quinonediazide group, with the aromatic group of the o-quinonediazide group being unsubstituted or substituted with an alkyl group or an alkoxy group, and x and y each represent the molar proportions of the respective structural units and $x/x+y$ ranges from about 0.05 to about 0.5,

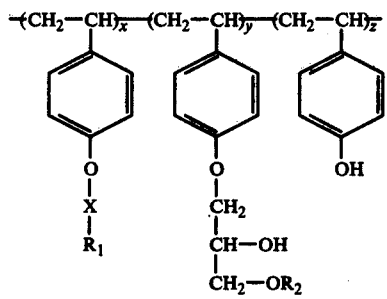
(II)

wherein X and $R_1$ have the same meanings as in General Formula (I), $R_2$ represents an alkyl group, an aryl group or an alkyl or aryl group substituted with an o-quinonediazide group, and x, y and z each represent the molar proportions of the respective structural units and $x/x+y+z$ ranges from about 0.05 to about 0.5 and $y/x+y+z$ ranges from about 0.05 to about 0.2.

7. The photosensitive lithographic printing plate as set forth in claim 6, wherein said o-quinonediazide group-containing polymer is represented by the structural formula (I) and $x/x+y$ range from 0.1 to 0.4.

8. A method of forming images comprising exposing the photosensitive lithographic printing plate as set forth in claim 6 to actinic radiation and developing said exposed photosensitive lithographic printing plate in an alkaline solution developer.

9. The photosensitive lithographic printing plate as set forth in claim 8, wherein said photosensitive layer includes at least one of a dye, a plasticizer, and a spiropyran compound.

10. The photosensitive lithographic printing plate as set forth in claim 9, wherein said photosensitive layer includes an alkaline solution-soluble resin as a binder.

11. The photosensitive lithographic printing plate as set forth in claim 10, wherein said alkaline solution-soluble resin is a phenol-formaldehyde resin, a cresol resin, a styrenemaleic anhydride copolymer or shellac.

12. The photosensitive lithographic printing plate as set forth in claim 11, wherein said o-quinonediazide group-containing polymer is present in an amount of more than about 20% by weight to the total weight of the mixture of the o-quinonediazide group-containing polymer and the alkaline solution-soluble binder resin.

13. The photosensitive lithographic printing plate as set forth in claim 6, wherein said aromatic o-quinonediazide group is a 1,2-benzoquinonediazide group, a 1,2-naphthoquinonediazide group, a 3,3',4,4'-biphenyl-bis-quinonediazide group or a 2,3-phenanthrenequinonediazide group.

14. The photosensitive lithographic printing plate of claim 6 wherein said polymer consists of the polymer of the formula (I).

15. The photosensitive lithographic printing plate of claim 6 wherein said polymer consists of the polymer of the formula (II).

16. The photosensitive lithographic printing plate of claim 15 wherein $R_2$ is

* * * * *